United States Patent [19]

Mahig

[11] 4,414,517
[45] Nov. 8, 1983

[54] NON-RINGING PHASE RESPONSIVE DETECTOR

[76] Inventor: Joseph Mahig, 701 SW. 91st St., Gainesville, Fla. 32601

[21] Appl. No.: 273,166

[22] Filed: Jun. 12, 1981

[51] Int. Cl.³ .......................... H03H 7/01; H03K 5/26
[52] U.S. Cl. .................................... 333/167; 328/138;
328/140; 324/78 F; 333/176
[58] Field of Search ............. 333/167, 175, 176, 17 R;
328/138, 140, 155, 167, 55; 329/110; 324/78 F;
307/522–525, 543

[56] References Cited

U.S. PATENT DOCUMENTS

| | | | |
|---|---|---|---|
| 3,747,025 | 7/1973 | Iten et al. | 328/167 X |
| 3,761,740 | 9/1973 | Naive | 328/155 X |
| 4,145,660 | 3/1979 | Allen et al. | 328/140 X |
| 4,215,280 | 7/1980 | Mahig | 328/138 X |

Primary Examiner—Marvin L. Nussbaum
Attorney, Agent, or Firm—Dowell & Dowell

[57] ABSTRACT

A non-ringing circuit for detecting the presence of predetermined frequency components in input signals and for delivering an output signal when a predetermined component is dominant, the circuit employing plural tuned filters with different adjacent cross-over frequencies, and using coincidence detectors connected to pairs of these filters in such a way as to detect when there exists a dominant frequency component having a frequency so located with respect to said cross-over frequencies that the relative phases of the signals fed to the coincidence detectors from the filters will produce phase coincidences therein, the circuit further using multiple different paired filters having staggered cross-over frequencies such that the tendencies of these filters to ring as a result of transient excitations will produce diverse and non-coincident ringing wave forms.

10 Claims, 8 Drawing Figures

NON-RINGING PHASE RESPONSIVE DETECTOR

BACKGROUND AND PRIOR ART

This invention relates to phase-sensitive frequency detector circuits of an improved type which minimize the tendency of the tuned circuits to ring after a driving signal is applied or removed, whereby the circuit is particularly effective for the detection of pulses or transients, as well as long term signals which may appear in the presence of other spurious frequencies.

It is frequently desirable to detect the presence of a signal of predetermined frequency, which may also appear in the presence of undesired signals either of long term or short term duration. It is also desirable at times to provide information on the frequency spectrum of a signal by determining the presence of particular frequencies in real time, and to indicate such presence as a binary output which is compatible for use with a digital computer. More particularly, it is desirable to provide binary-indicated detection which is delivered during the signal and which ends immediately after the detected signal is terminated.

It is well known that when a wide band signal is passed through a tuned circuit having a given resonant or cross-over frequency, the phase of the output signal whose frequencies are above cross-over is shifted about 180°. If two paths of tuned circuits, low-pass, high-pass, or band-pass are coupled to receive an input signal, and if their pass-bands overlap somewhat, then the two output signals resulting from an input signal which is either entirely above both cross-overs or entirely below both cross-overs will be essentially in phase with each other. On the other hand, in the case of an input signal lying between the two cross-overs, the output signal from one filter will be about 180° out of phase with the output signal from the other filter. This difference in phase can be used to drive a concidence detector responsive to their relative phases so as to determine when the dominant component of an input signal applied to the two filters results in in-phase outputs from the filters, or out-of-phase outputs therefrom. Those frequency components which are outside the pass bands will produce a different response in the coincidence detector than those which are between the pass bands.

My U.S. Pat. No. 4,215,280 shows such a detector system for detecting the presence of selected frequency components of an input signal, and operative to deliver an output responsive thereto when an input signal contains frequency components within certain limits determined by the design of the filter system itself. This filter system generally comprises two filter paths in which dominant input frequencies which are outside of both filter pass bands are found to produce components which have in-phase relationship at the outputs of the filters, but wherein signals located between the cross-over frequencies of the two paths are out-of-phase with respect to each other at the outputs of the paths, so that a coincidence detector can be made to deliver an appropriate binary output signal resulting from detection of these mutual phase relationships. This patent shows various systems using low pass filters, high-pass filters, combinations thereof, or band pass filters in each path, whose outputs are coupled to the coincidence detector. The present invention uses detectors of this type to accomplish its purpose, which is to provide an improved detection system which minimizes ringing effects of the tuned circuits.

Whenever a signal is applied to a filter, or whenever the signal is abruptly removed from the filter, the resonant circuit in the filter system tends to ring at its own natural frequency. This is particularly true of transient signals driving filter systems. The steep leading edge of a transient signal is ideal in shape to excite a tuned circuit to ring at its own natural frequency. Likewise, cessation of the transient provides another steep edge exciting more ringing of the tuned circuit. Since the present system uses binary gates as detectors, such ringing effects are very damaging, since they falsely indicate the passage of signals within the pass band. Damping of the circuit will, of course, eventually attenuate the ringing effect, but before attenuation can occur the output of a detector is severely obscured by spurious signals, for instance, during analysis of transient signal components, etc., i.e. pulse signals.

In the analogic case, a very similar situation occurs. If analogic signals are suddenly turned on or off, without smoothing, severe ringing will occur leading to spurious output. Generally, in the analogic case smoothing transients are in fact present which tend to reduce the amplitude of ringing oscillations, but in the digital case smoothing transients are absent and therefore such circuits must be considered on the whole as noisier.

Ringing of the tune circuits, can be analyzed in the following manner.

When the signal is first applied to a two path filter, both of its resonant circuits will be excited by the same leading edge and will ring initially in phase. A similar effect also occurs immediately after a signal is abruptly cut off. The duration of the ringing, of course, depends upon the circuit damping, but the beginning of the ringing in two similar tuned circuits will be in phase only initially and will almost immediately begin to go out of phase, assuming that the tuned circuits are not tuned to identical frequencies, whereby each tuned circuit resonates at a slightly different frequency from the other. As a result, what can be described as a "beating phenomenon" occurs since the oscillations in the two circuits will appear to drift alternately out-of-phase and then back into phase again at a regular rate. Thus, at the outset when two similar tuned circuits are driven, two effects will be at work to prevent output from a coincidence detector coupled thereto. One is the effect of resistive damping in both filters, and the other is the result of their tendency to immediately drift out-of-phase as viewed at the coincidence detector. Ordinarily, sufficient damping is designed into each circuit so that after a few cycles of ringing the output will fall below the threshold signal level to which the coincidence detector is responsive. The present system takes advantage of the tendency of the differently tuned circuits to drift out-of-phase, in order to eliminate output from the coincidence detector due to such ringing. This is done by phase comparison of the binary response signals from the coincidence detector. The following discussion will be illustrated in terms of filter systems of the types shown in my above-mentioned U.S. Pat. No. 4,215,280, employing one or more filter circuits in multiple paths leading to coincidence detectors.

THE INVENTION

The present invention comprises multiple similarly tuned filter circuits connected in pairs to coincidence detectors whose binary response signals are then connected together by logical gates to provide binary output which is responsive to the frequency of the dominant component of the input signal passing through all of the filters. If two filters are used, they can be tuned to slightly different cross-over frequencies but they will still pass a desired dominant frequency component of an input signal to indicate the presence of that component at the output of the final binary gate. However, since the filters are provided with slightly different cross-over frequencies, they will tend to ring at different natural frequencies in response to transient excitation. As soon as the drive signal ends, however, the several tuned filter circuits will diverge in phase from coincidence with each other. If only two resonant circuits are provided, after only a few cycles the coincidence detector will deliver another coincidence output, showing that the two beating oscillations of the filters have come back into phase again. The number of times this occurs can, of course, be minimized by increasing the damping in each tuned circuit, but such increase also decreases the Q of the circuits, and therefore the efficacy of the detector. On the other hand, if three tuned circuits are used, driving several coincidence detectors which are subsequently ANDed together, then a detector results in whose output it will take a much longer time for the multiple beat frequencies to come back into phase coincidence again. By careful selection of these tuned frequencies and the pairing of these filters this time can be extended considerably, whereby less resistive damping is necessary in each tuned circuit. Obviously, four or five such tuned circuits will still further extend the time before any mutual coincidence recurs, thereby providing more complete suppression. Selection of the differences between their respective natural frequencies can place this time well beyond the time required for attenuation of the ringing signals to the point where they will no longer operate the coincidence detectors. Therefore, high-Q circuits can be used. For example, in the case where five of them are used, a very high-Q detector can be formed in which output due to internal ringing is virtually eliminated. The circuits can also be provided with a deadband threshold level below which the coincidence detectors will not be responsive. A computer can be used to control the threshold level of the deadband, whereby multiple signal passes can be made through the filter with different thresholds to obtain enhanced analysis of input frequencies in the presence of noise. Moreover, inverters can be used in series with one or more of the filter outputs to the coincidence detectors to provide novel circuit arrangements having special frequency response characteristics.

OBJECTS AND ADVANTAGES OF THE INVENTION

It is the principal object of this invention to provide a phase responsive frequency detection system which uses high-Q filter circuits, but which is virtually non-responsive to the tendency of these circuits to ring when they are shocked by the application of an input signal or by its removal from the filter, or where the signal is of transient or pulse nature.

It is another major object of this invention to provide non-ringing high-Q filter systems which can be made using RC circuit components with operational amplifiers, and which uses binary AND gates and OR gates connected as coincidence means to achieve the desired detection of signals or analysis of a spectrum of signals.

Still another object of the invention is to provide a filter having a deadband threshold level beneath which input signals will be of insufficient amplitude to operate the coincidence detectors, and wherein a computer can be used to control the threshold level by the selection of different bias levels.

Yet another object of the invention is to provide a system in which the degree of immunity of the over-all detector system to ringing can be varied by changing the number of tuned circuits employed in the detector and by adjusting their natural frequencies to different staggered values specifically selected to postpone as long as desired the return to in-phase coincidence by all of the circuits during the period of time when they are ringing.

Other objects and advantages of the invention will become apparent during the following discussion of the drawings.

THE DRAWINGS

ILLUSTRATIVE EMBODIMENTS

Figure 1:
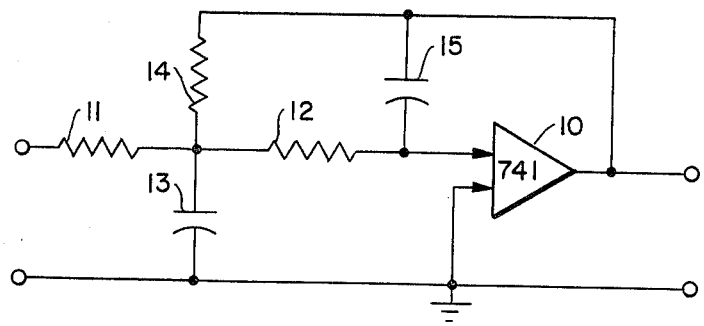
FIG. 1 is a schematic diagram showing a typical example of a tuned circuit using an operational amplifier wherein the cross-over frequency is determined by RC circuit components.

There are a plurality of electronic resonant circuits which are well known in the prior art, some of which are shown in my Pat. No. 4,215,280, and others of which, for instance active RC circuits, are described in the "Handbook of Operational Amplifier Active RC Networks" published by Burr-Brown Research Corporation, Tuscon, Arizona. Such operational amplifier tuned circuits are typically low-pass, high-pass, band-pass, etc. FIG. 1 of the present drawing shows a typical low-pass filter which can be found on Page 74 of the above Burr-Brown Research Corporation Handbook. This low-pass filter uses an operational amplifier 10 fed by a low-pass RC input circuit comprising resistors 11 and 12 and a shunting capacitor 13. The operational amplifier has a feedback path comprising the resistor 14 and a capacitor 15. The Burr-Brown manual teaches the manner of selecting these circuit values in order to provide a specific cross-over point for the filter.

Figure 2:
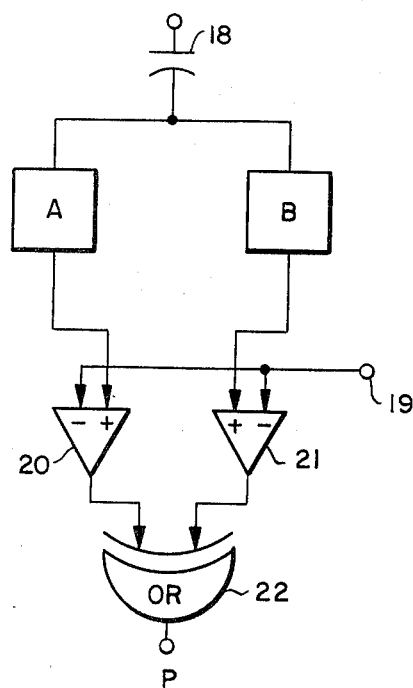
FIG. 2 is a diagram showing a detector having two tuned paths delivering signals to a coincidence detector comprising comparators feeding an exclusive OR gate delivering a binary output response.

In FIG. 2, two tuned filters are represented by two blocks labeled A, B. These filter blocks can be typical active RC filters, or can be of some other type. These blocks respectively have their outputs coupled to two operational amplifiers, respectively comprising comparators labeled 20 and 21. If the two filters A and B have cross-over frequencies at $f_a$ and $f_b$ which are located fairly near to each other, then an input signal entering through the capacitor 18 will deliver an output from only one of the operational amplifiers 20 or 21 if the frequency of the input signals is between $f_a$ and $f_b$. In order to further suppress noise and low amplitude signals, a bias can be applied at terminal 19 to provide a threshold beneath which any output from filter A or filter B will not initiate a response from the comparator 20 or 21. The outputs of these comparators are then delivered to an exclusive OR gate. If the input signal is between $f_a$ and $f_b$ only one of the comparators 20 or 21 will deliver an output above the threshold, and therefore the exclusive OR gate 22 will deliver an output to its terminal P indicating the presence of a signal component between the two cross-over frequencies $f_a$ and $f_b$.

Figure 3:
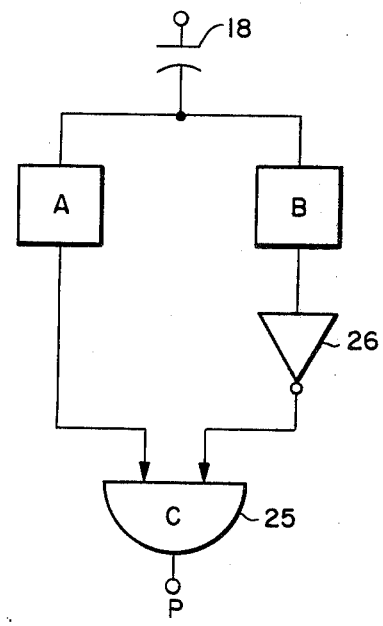
FIG. 3 is a diagram showing a dual path detector using an inverter and a concidence detector.

FIG. 3 likewise uses an input capacitor 18 and two filters A and B, both of which drive a concidence detector 25. If the two filters A and B have similar crossovers $f_a$ and $f_b$ and if the input signal at the capacitor 18 has a dominant component between these crossover frequencies, then the signals coming out of the two filters A and B will be 180° out of phase for the dominant component since this component is above one crossover but below the other. Hence, an inverter 26 is inserted in the output filter B so that it will be inverted with respect to the output from the filter A so as to provide in-phase signals at the coincidence detector 25, whereby the FIG. 3 circuit will be responsive only to signals between $f_a$ and $f_b$ but not to any other frequency inputs.

Figure 4:
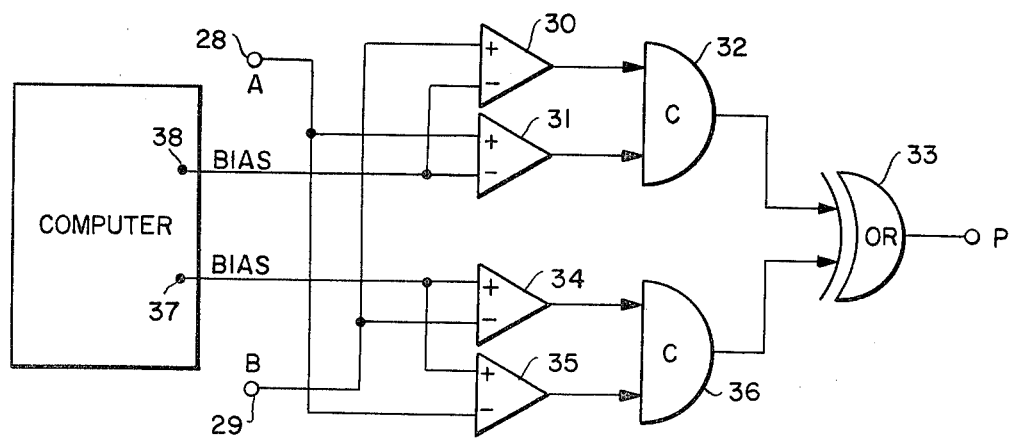
FIG. 4 is a diagram showing a dual polarity coincidence detector having computer-controlled threshold levels.

FIG. 4 shows a more complex coincidence detector circuit for receiving input signals from filters A and B at input terminals 28 and 29. This detector has the advantage of being responsive to both positive and negative-going half cycles of the outputs from the various filters. When both of the signals from the filters are positive in polarity, the comparators 30 and 31 both provide output signals to the coincidence detector 32 which then delivers an output signal to exclusive OR gate 33, the detector 36 delivering no signal, and the exclusive OR gate delivering an output at P. Conversely, if both inputs A and B go negative at the same time, they then respectively deliver their signals through the comparators 34 and 35 so that a signal is delivered to the coincidence detector 36 which then delivers a positive signal to the exclusive OR gate 33. No output appears from gate 32, and therefore the OR gate 33 again delivers an output signal at P. In this way, both positive and negative half cycles of corresponding input signals are operative alternately to drive the inputs of the exclusive OR gate 33. On the other hand, if the input signals delivered at 28 and 29 from the filters A and B are different in phase, then only one of the inputs to both of the coincidence detectors 32 and 36 will be enabled at any particular moment, whereby neither detector will deliver an output to the exclusive OR Gate 33 and no coincidence signal will appear at P.

However, since filters are imperfect, their outputs do not simply constitute pass-band frequency components, but usually include other noise and spurious frequencies which have passed through, although good filters will deliver the spurious components at reduced amplitudes. In certain spectrum analyzing applications, it is useful to be able to cut off the unwanted components at different selected amplitude levels. For this purpose, a computer can be used to deliver positive and negative bias signals at the terminals 37 and 38 which establish threshold levels which must be exceeded by the input signals from the filters in order to provide outputs from the comparators 30, 31, 34 and 35. One way is to have the computer programmed to delivering selectable different bias voltages at the respective terminals 37 and 38 so that the thresholds can be changed step-wise to achieve different degress of immunity to unwanted components. Appropriate bias voltages can also be used to provide an on-off function for the coincidence detector so as to render it operative or inoperative at the command of the computer.

It will be recalled that a major purpose of the present invention is to provide a detector which is essentially immune to undesired ringing effects of the various filters used in the circuit. Suppression of ringing effects according to the teaching of the present invention is achieved by using a larger number of tuned filter circuits which are respectively tuned to somewhat different frequencies, generally frequencies which are close together. As stated above in the description of the invention, when a tuned circuit is driven or when the drive is abruptly removed from it, it tends to ring at its natural frequency. Moreover, very shortly after the excitation, that is after only a brief interval of time comprising a fraction of a cycle or only a few cycles, the ringing output of several such tuned circuits which are tuned to somewhat different frequencies will go out of phase with respect to each other and therefore the coincidence detector will cease to show coincidence, whereby the ringing of the filters will fail to cause significant output from the over-all circuit. The difficulty with using only two tuned filters whose difference is $f_a-f_b$ is that they go in and out of phase with a period equal to the reciprocal of the difference frequency as the beat comes and goes. By using three tuned circuits which have different spacings between their staggered frequencies, it is possible to have greater control over the time elapsing before coincidence recurs with the phases of all three tuned circuits. Obviously four or five tuned circuits provide even greater control over the elapsed period of time before phase coincidence occurs again. During an elapsed period which covers considerable real time, the damping due to losses in the tuned circuits will have decreased the amplitudes of the ringing effects to the point where they can no longer drive the coincidence detectors. By carefully selecting the differences in frequencies of the stagger-tuned circuits, it is possible to keep them out of phase with one another until the ringing dies out for all practical purposes.

Figure 5:
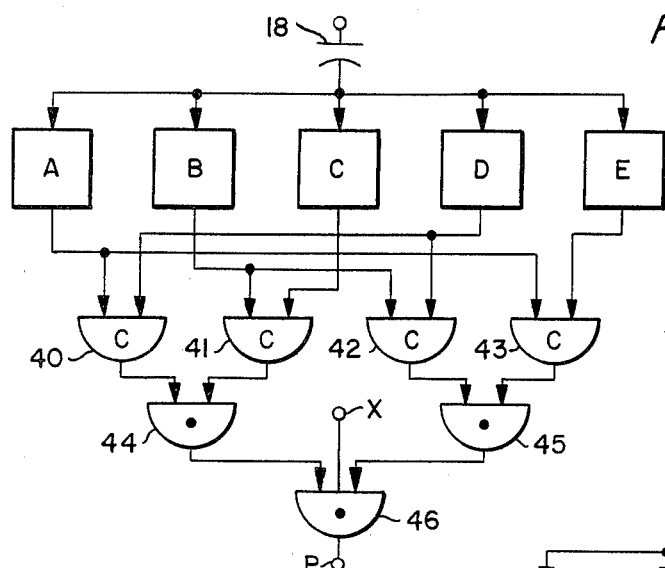
FIG. 5 and FIG. 6 show basic ringing suppressor circuits useful as detectors.

FIG. 5 shows a circuit employing multiple resonant circuits coupled to coincidence circuits in a manner providing a detector which is virtually immune to ringing. It is particularly useful for detecting wide-band pulses which have a dominant component of frequency offset adjacent to, but on the same side of all of the resonant frequencies of the filters A through E. As soon as the drive pulse at the input ceases, the circuit suppresses any further tendency to respond, as its staggered tuned circuits continue to ring. The input signals are fed through a capacitor 18 into five stagger-tuned filter circuits having tuned frequencies such that when driven, the filters are able to pass said dominant signal component. As long as drive is present through capacitor 18 into the five tuned circuits A, B, C, D and E, all five circuits will continue to pass the dominant signal component to the coupled coincidence detectors 40, 41, 42 and 43. If the components of frequency from the filters are offset on the same side of the tuned pass-bands of the filters, and therefore arrive at the coincidence detectors mutually in-phase, the detectors 40, 41, 42 and 43 will deliver the outputs to the AND gates 44 and 45 which will in turn, drive two of the three inputs to the AND gate 46. If its third input is enabled at X, an output signal will be delivered at P.

However, as soon as the input is removed from the capacitor 18, the five tuned circuits A, B, C, D and E will begin to ring at their natural frequencies. Since these frequencies are mutually different, the ringing signals go out of phase almost immediately. If the frequencies are selected properly, the ringing signals will never come back to in-phase relationship before the circuit damping has reduced their amplitudes to levels beneath which the coincidence detectors will not respond.

Figure 6:
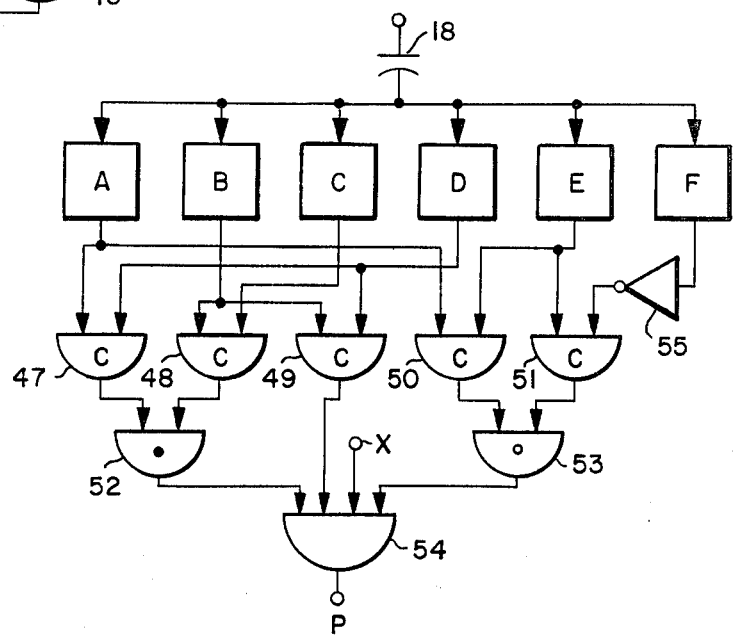

FIG. 6 shows a circuit that will work well both for continuous signals having a spectrum of frequencies therein, and also for pulse signals wherein the pulses comprise bursts of plural frequencies which dominate the background signals. FIG. 6 comprises six filters forming an illustrative example employing low-pass filters A, B, C, D, E, and F, of which the filter F is assumed in this embodiment to have the highest crossover frequency, and the natural frequencies of the other five filters are assumed to be spaced progressively lower. For convenience, the difference between adjacent frequencies is assumed to be $\Delta f$. An important reason for staggering the frequencies progressively lower is so that the beat frequencies between them will cause suppression of the ringing to occur rapidly after input signal cessation. The use of multiple filters effectively delays the return to in-phase ringing until circuit damping can attenuate the oscillations below dead-band threshold levels, thereby providing a high degree of suppression of spurious detector response.

The filters of FIG. 6 are coupled to deliver their outputs in pairs to coincidence detectors 47, 48, 49, 50 and 51, so that selected pairs of filters represent beat frequencies of $\Delta f$, $2\Delta f$, $3\Delta f$ and $4\Delta f$. The binary response signals from the coincidence detectors 47 and 48 drive an AND gate 52; the outputs of the detectors 50 and 51 drive an AND Gate 53; and the outputs of the AND Gates 52 and 53 as well as the output response of the coincidence detector 49 drive an AND Gate 54, whereby when all AND gate inputs are enabled including the control input X, the AND gate 54 delivers an output at P. The principal difference between the circuit of FIG. 6 and that of FIG. 5 is that one additional filter F has been added, and has been connected through an inverter 55 to the coincidence detector 51. Thus, the circuit discriminates between those dominant signal inputs which lie respectively above the cross-over frequency of the filter E and below the cross-over frequency of the filter F, which has the highest cross-over frequency. When a signal is delivered through the capacitor 18 to the inputs of all six filters, if the frequency of the dominant input component is between the crossover of the filter E and the cross-over of the filter F, then the filters A, B, C, D and E will all react similarly to the signal, delivering mutually in-phase outputs to enable the coincidence detectors 47, 48, 49 and 50. However, the filter F whose cross-over is above the frequency of the dominant component will deliver the opposite phase, and this opposite phase signal will be inverted by the inverter 55 so as to enable the detector 51 at its other input. Since all of the coincidence detectors 47 thru 51 are now fully enabled with in-phase input signals, they will deliver outputs which when ANDed together will produce an output signal at point P, assuming that the X input of the Gate 54 is enabled. As a result, the circuit shown in FIG. 6 will deliver an output at point P if, and only if, the input signal has its dominant frequency component between the frequencies of the filters E and F. FIG. 6 therefore provides an extremely sharp cut-off characteristic, and a non-ringing detector at the same time. It should also be apparent that other inverters similar to the inverter 55 can be placed at other locations in the filter of FIG. 6 so as to provide cut-offs occuring between others of the successive filters shown therein.

Considering the circuit of FIG. 6, a practical circuit can be designed as follows:

Assume a time constant for the filter F (the highest frequency filter) to be $\tau$, and assume that $f_a < f_b < f_c < f_d < f_e < f_f$. Further assume a constant frequency difference $\Delta f$ between each adjacent pair of the six filters.

It will be apparent from the diagram of FIG. 6 that when all filters are ringing, i.e., as when briefly excited, the lowest beat frequency will appear at the inputs to the detector 48 and will be equal to $\Delta f$. The period T of the beat frequency will be $1/\Delta f = T(f_b, f_c)$. Now if a selection is made such that $T(f_b, f_c) = 4\tau$, the damping will have reduced the ringing amplitudes by 98% at the end of that interval of time. However, during this interval there will have been times when an output would re-appear at the detector 48. Such outputs can, however, be suppressed at the output signal P by connecting others of the coincidence detectors 47, 49, 50 and 51 to paired filters having different $\Delta f$ multiples, such as detector 47 with a period $T(f_a, f_d) = \frac{1}{3}\Delta f$, or detector 49 with a period $T(f_b, f_d) = \frac{1}{2}\Delta f$, or detector 50 with a period $T(f_a, f_e) = \frac{1}{4}\Delta f$. It should also be apparent that since $\Delta f$ is assumed to be constant, this paragraph is discussing the simplest case. By using non-integer multiples of $\Delta f$ additional suppression pairs can be created so that the suppression of ringing can be improved materially. However, even in the present simplified example, the period of suppression is long enough so that the use of multiple selected pairs will cause the ringing to die out before all of the detectors 47 through 51 can become activated simultaneously. Moreover, if this does not occur within the period $1/\Delta f$, the damping will have reduced ringing below amplitudes at which the ringing can drive the logic circuitry.

Figure 7:
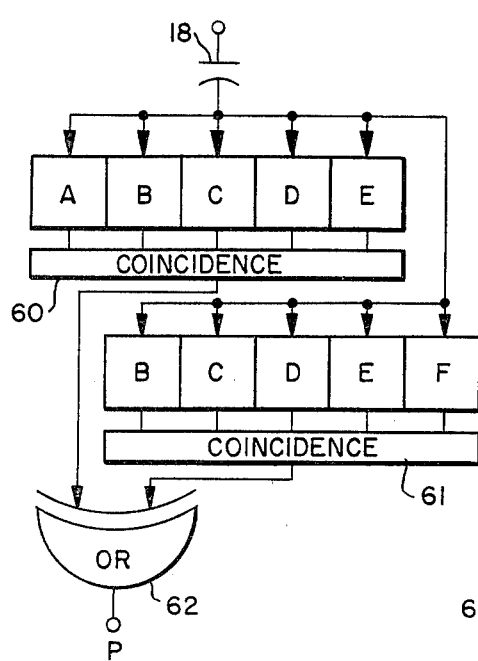
FIG. 7 and FIG. 8 are embodiments of two different filter systems, each employing more than one filter circuit of the general type shown in FIGS. 5 and 6.
Figure 8:
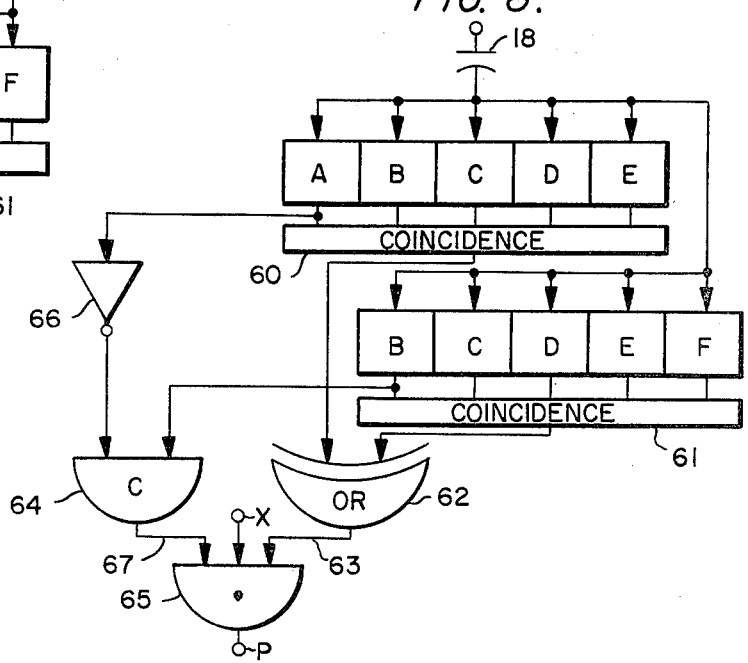

Circuits of the type shown in FIG. 6 may also be viewed as components of a larger over-all, i.e. ganged, detector system, for instance, using two or more ringing suppression circuits of the type shown in FIG. 5 whose outputs are coupled by AND or OR gates as shown in FIGS. 7 and 8.

FIG. 7 is essentially two non-ringing detector circuits as shown in FIG. 5 connected together by an exclusive OR gate, and each of the circuits having one additional tuned filter not appearing in the other. For instance, the upper circuit shown in FIG. 7 includes low-pass filters A, B, C, D and E; whereas the other circuit includes low-pass filters B, C, D, E and F. The six cross-over frequencies A through F are assumed to increase or decrease monotonically. If the outputs of these two detector circuits are respectively connected to coincidence circuits 60 and 61, an overall detector can be made by connecting the outputs of the coincidence circuits 60 and 61 to an exclusive OR gate 62. This combination of two detectors of the type shown in FIG. 5 results in a composite detector which is sensitive only to input frequencies which lie between the cross-overs of filters A and B, and between the cross-overs of filters E and F. This is true, because if a signal is put into the input capacitor 18 whose dominant frequency lies below the cross-over of filter A then all ten filter circuits will pass the signal with the same phase and both coincidence detectors 60 and 61 will show coincidence at the output, but the exclusive OR gate 62 will reject these signals because both inputs to the OR gate will be enabled simultaneously. No output P therefore results. Likewise if the dominant input signal is above the cross-over frequency of the filter F, the outputs to the coincidence detectors 60 and 61 will all be mutually in phase, and simultaneous enabling signals will appear on both inputs to the exclusive OR gate 62, whereby no output will result at P. However, if the input signal has a dominant component that lies between the cross-overs of filters A and B, then an output signal will result because no coincidence will appear in the detector 60, but coincidence will appear in the detector 61, whereby the exclusive OR gate 62 will deliver an output at P. The same is obviously true for a dominant frequency component lying between the cross-overs of filters E and F. In this case, coincidence detector 60 will deliver an output, whereas coincidence detector 61 will not. Therefore, the exclusive OR gate will deliver an output at P. If the signal lies between the frequencies of B and E, no output will result at point P, because neither coincidence detector will have an output to the exclusive OR gate 62. Thus by assembling two non-ringing detectors of the type shown in FIG. 5 to make a composite detector, it has been possible to sharpen the frequency discrimination characteristics.

FIG. 8 shows still another composite arrangement of two non-ringing detectors of the general type shown in FIG. 5 which provides a single coincidence characteristic which is very sharp in its frequency discrimination capabilities. It will be recalled that the filter shown in FIG. 7 is responsive only to input components whose frequencies lie either between the cross-overs of filters A and B or between the cross-overs of filters E and F. FIG. 8 includes all of the FIG. 7 circuit, showing these filters A through F plus the coincidence detectors 60 and 61 and the exclusive OR gate 62. Thus, the output on the wire 63 will be high for dominant signals between cross-overs of A and B, or between cross-overs of E and F, but not for any other frequencies. However, in FIG. 8 one additional coincidence detector 64 has been added which drives one input to the final AND gate 65, and this coincidence detector 64 is sensitive only to a dominant component of frequency lying below the cross-over frequency of the filter B, but above the cross-over frequency of filter A. An inverter 66 is used to connect the output of the filter A with coincidence detector 64. Therefore a signal appearing between the cross-over frequencies of the filters A and B will provide the same output on both inputs to the coincidence detector 64 so that it will provide an output on the wire 67. As a result, if an input signal lies between the cross-overs of filters A and B, outputs will appear on both wires 63 and 67, whereby the AND gate 65 will deliver a signal P, if its X input is enabled. However, only the wire 63 will go high if the dominant signal appears between the cross-overs of filters E and F, and no output will appear on the wire 67 under these conditions. As a result, the circuit of FIG. 8 is not sensitive to two input frequencies as was the case with FIG. 7, but is sensitive only to the lower of these two frequencies, namely the frequency between the cross-overs of filters A and B. Other similar uses of inverters and coincidence detectors can be made by connecting them instead to the outputs of others of the filters to produce an over-all circuit having different discriminatory characteristics while still preserving the non-ringing feature.

A simpler circuit of the type shown in FIGS. 7 and 8 can be provided by eliminating the second row of filters B, C, D and E and by properly taking output signals from the upper B, C, D and E filters. Thus, where many tuned circuits are available to provide output signals, these can be differently coupled to a group of coincidence detectors, each of which compares phases of signals from driven circuits to provide appropriate outputs, but each of which is substantially insensitive to ringing signals when the circuits are not actually being driven.

The features which the above practical examples of filters have in common is the sharpness of their frequency discriminations, and their immunity to spurious outputs caused by ringing of the various tuned circuits within the filters.

The present invention is not to be limited to the exact illustrative embodiments, since changes can be made therein within the scope of the following claims.

I claim:

1. A non-ringing circuit for detecting the presence of a predetermined frequency component in an input signal and for delivering an output signal when said predetermined component is dominant, the detector comprising:
    (a) multiple tuned filters each having an input terminal connected to receive said input signal and having an output terminal at which the frequency components appear, and each filter having a tuned frequency near said predetermined frequency, said tuned frequencies of the respective filters being different each from the other by increments of frequency.
    (b) plural coincidence detector means coupled to selected paired filter output terminals, and said coincidence detector means being operative to deliver plural binary response signals indicating whether the dominant frequency components appearing at the respective filter output terminals are mutually in phase or out of phase; and
    (c) gate means connected to receive said binary response signals, said gate means comprising a logic circuit responsive to the binary states of said response signals and operative to deliver said output signal when the predetermined frequency component dominates said input signal.

2. The non-ringing circuit as claimed in claim 1, wherein said increments of frequency between filters have periods ranging between 0.5 and 10 times the time constant of the filters.

3. The non-ringing circuit as claimed in claim 1, wherein said predetermined frequency component lies intermediate the highest and lowest tuned frequencies of said multiple filters, and wherein inverters are inserted between the outputs of certain of the filters and the associated coincidence detectors and cooperate with said logic circuit to enable said output signal when the predetermined frequency component dominates said input signal.

4. The non-ringing circuit as claimed in claim 1, wherein said coincidence detector means comprise first coincidence detector means connected to paired filters including at least one filter whose tuned frequency is below said predetermined frequency, and comprise second coincidence detector means connected to paired filters including at least one filter whose tuned frequency is above said predetermined frequency, and said gate means being coupled to said coincidence detector means and being responsive to the binary states of their respective responsive signals.

5. The non-ringing circuit as claimed in claim 4, wherein said gate means comprises an exclusive OR gate coupled to receive the response signals from the respective coincidence detector means.

6. The non-ringing circuit as claimed in claim 4, wherein said gate means comprises AND gate means coupled to receive the response signals from the respective coincidence detector means.

7. The non-ringing circuit as claimed in claim 6, including inverters inserted between the outputs of certain filters and the associated coincidence detector means and operative to cooperate with said logic circuit to enable said output signal.

8. The non-ringing circuit as claimed in claim 6, wherein the AND gate means includes one more input than the number of response signals coupled to it, and said additional input comprising an on-off control terminal for the non-ringing circuit.

9. The non-ringing circuit as claimed in claim 1, wherein said coincidence detectors means have a threshold level such that the detector means are not responsive to frequency components whose amplitudes fall below said threshold levels.

10. The non-ringing circuit as claimed in claim 9, wherein said coincidence detector means include bias level terminals which control said threshold levels; and means for applying bias levels to said terminals.

* * * * *